US007894170B2

United States Patent

(12) United States Patent
Liao et al.
(10) Patent No.: US 7,894,170 B2
(45) Date of Patent: Feb. 22, 2011

(54) ESD PROTECTION DEVICE

(75) Inventors: Hsueh-Kun Liao, Hsin Chu Hsien (TW); Tao Cheng, Hsin Chu (TW)

(73) Assignee: Mediatek Incorporation, Hsin-Chu (TW)

( * ) Notice: Subject to any disclaimer, the term of this patent is extended or adjusted under 35 U.S.C. 154(b) by 301 days.

(21) Appl. No.: 11/081,705

(22) Filed: Mar. 17, 2005

(65) Prior Publication Data

US 2005/0207078 A1 Sep. 22, 2005

(30) Foreign Application Priority Data

Mar. 19, 2004 (TW) .............................. 93107574 A

(51) Int. Cl.
*H02H 9/00* (2006.01)

(52) U.S. Cl. ........................................................ 361/56

(58) Field of Classification Search .................... 361/56
See application file for complete search history.

(56) References Cited

U.S. PATENT DOCUMENTS 5,784,242 A * 7/1998 Watt ........................... 361/111
5,789,964 A * 8/1998 Voldman .................... 327/380
5,838,146 A * 11/1998 Singer ........................ 323/270
6,171,893 B1 * 1/2001 Wu ............................ 438/200
6,373,668 B2 * 4/2002 Yamaguchi .................. 361/56
6,674,622 B1 * 1/2004 Yu et al. ........................ 361/56
6,989,979 B1 * 1/2006 Tong et al. ................. 361/91.1
7,102,862 B1 * 9/2006 Lien et al. ...................... 361/56
7,768,753 B2 * 8/2010 Fankhauser et al. ........... 361/56

* cited by examiner

*Primary Examiner*—Jared J Fureman
*Assistant Examiner*—Ann T Hoang
(74) *Attorney, Agent, or Firm*—Birch, Stewart, Kolasch & Birch, LLP

(57) ABSTRACT

For maintaining the regular operating current in an inner circuit under electrostatic discharge (ESD) event, an ESD protection device is provided to control an ESD path switch in the turned-on condition by employing a MOS device and a latch-detected turned-on circuit. The MOS device has a self-aligned silicidation (Salicide) therein. The ESD protection device is used to stabilize operation efficiency and reduce the area of an ESD protection device without a silicide block disposed therein for enhancing the ESD protection capability.

6 Claims, 8 Drawing Sheets

VDD
C
Q
P
M1
M2
M3
VSS

ESD PROTECTION DEVICE

BACKGROUND OF THE INVENTION

1. Field of the Invention

The present invention relates to an ESD protection device employing a MOS device and a latch-detected turned-on circuit, in which the MOS device comprises salicide process, to maintain the regular operating current in an inner circuit during an electrostatic discharge event.

2. Description of Related Art

Electrostatic discharge (ESD) is the major reason for electrical overstress (EOS) in electrical devices or an electrical system during operation. With the precision of the manufacturing process, the size of electrical devices is much smaller, so an unexpected electrostatic discharging event can break down the electrical devices. Moreover, the effect of ESD will cause a permanent damage of the semiconductor device or any other computer system for further influence of the electrical product.

It's extremely hard to prevent the human factor resulting in ESD. During the processes of manufacturing, producing, assembling, testing, depositing or even transporting, electrostatic charge accumulates in the human body, instruments, depositing equipment, or even the electrical device itself. In some conditions, an electrostatic discharge path will be formed to damage the electrical device or computer system unexpectedly since the contact event occurs between the human body and the equipment, or between devices.

For effectively preventing ESD damage to electrical devices, an ESD path provided by an ESD protection circuit is used to discharge the current formed from ESD events in the device. The largest electrostatic current affordable by a regular ESD protection device is associated with the second breakdown point of the device. The second breakdown zone B and the second breakdown point D of the device are shown in FIG. 1, which is the I/V characteristic curve of the ESD protection device. The ESD protection device will cause the permanent damage if the current formed from an ESD event reaches the second breakdown zone B. The conventional ESD protection circuit is implemented with an inverse-biased diode, a bipolar transistor, a MOS device, or a silicon-controlled rectifier (SCR). The aforementioned circuit components use their own characteristics of the first breakdown to discharge the current formed from ESD event. The first breakdown zone A is shown in FIG. 1.

If the current formed from ESD event goes through a first breakdown point C and reaches the first breakdown zone A, the ESD protection device operates on the snap breakdown zone E as shown in FIG. 1, in which the ESD protection device will not be destroyed by the current. Accordingly, the ESD protection device is grounded and forms an electrostatic discharge path.

A regular ESD protection device is set up in accordance with a human-body model (HBM) or a machine model (MM). Since the electrostatic current goes into the inner circuit from human body or the machine via the IC pins, the ESD protection circuit is conventionally disposed beside the bonding pad of the inner circuit.

Since the electrostatic charges in charged-device model (CDM) are accumulated in the floating substrate of the device, the electrostatic charges are discharged through the grounded pins by way of an ESD path. The devices of gate electrode in the input end is easily to be damaged when an ESD event occurs in a charged-device model even if there is an ESD protection device used therein. The ESD protection device of the prior art is still not capable of discharging impulse ESD current in the charged-device model, in many cases.

FIG. 2 of the prior art shows schematic diagram of an ESD protection circuit. The ESD protection circuit 20 comprises a primary ESD clipper circuit 22, a secondary ESD clipper circuit 24, and a resistor 26. The resistor 26 connects with the secondary ESD clipper circuit 24 in series. The resistor 26 and the secondary ESD clipper circuit 24 connect with the first ESD clipper circuit 22 in parallel. An ESD protection circuit 20 disposed beside an input pad 29 is used to protect inner circuit 21 from the ESD current 25, which is shown as a dotted line (25) in FIG. 2 and produced by ESD voltage 23 input from outside. The ESD protection circuit 20 is used to prevent the inner ESD current 25 from damaging an input-stage CMOS 28 composed of PMOS and NMOS, and guide the ESD current 25 to ground 27.

If the ESD in a human body model or in a machine model occurs on the pins of the input pad 29, the ESD voltage 23 with high potential from outside is transmitted to the gate electrode of the input-stage CMOS 28. The major function of the secondary ESD clipper circuit 24 is used to restrain the high voltage input from the ESD voltage 23, and to prevent the gate electrode of the CMOS 28 from being damaged by the high ESD voltage.

The secondary ESD clipper circuit 24 is implemented with a short-channel NMOS in general, but that implementation is not capable of enduring a large ESD current 25, so the extra resistor 26 and the primary ESD clipper circuit 22 are provided to keep the ESD current 25 from the secondary ESD clipper circuit 24 composed of a short-channel NMOS.

Since the ESD current 25 is discharged through the primary ESD clipper circuit 22, the circuit 22 requires a protection device with a higher capability for current endurance. Moreover, the aforementioned devices possess a higher breaking voltage and a slower breaking speed, so the secondary ESD clipper circuit 25 is further required to protect the gate electrode of the CMOS 28 efficiently.

Nevertheless, the ESD protection circuit 20 of the prior art can be equivalent to the combination of the larger resistor and capacitor, and work in the snap breakdown zone E next to the first breakdown point A shown in FIG. 1. Conversely, to the input signal, a larger RC time constant delay is produced, and thus ESD protection circuit 20 is not suitable for high-frequency signals and current-mode input signals.

With the advancement of manufacturing processes, the process with light doped drain (LDD) and silicided diffusion is employed. Although the density and performance of the IC is improved, the problem of ESD protection is also amplified.

For improving the of ESD protection capability produced by the manufacturing process with light doped drain (LDD), an ESD-implant process is employed. Two different NMOS devices are produced in a unique manufacturing process of a CMOS; the devices with LDD structure are used for the inner circuit and the devices without LDD structure are used for the input/output stage. For merging the two NMOS devices mentioned above into one manufacturing process, the mask used for ESD-implant process and some extra processes are added. Further, since the NMOS device produced from ESD-implant process and the device with LDD structure are different, extra treatment and design are needed to retrieve the SPICE parameter of the NMOS device with ESD-implant process.

With regard to the manufacturing process, the process of the silicided diffusion mentioned above is used to reduce the parallel stray resistance in drain and source electrodes of the MOS device. The operating speed of a MOS device can then be enhanced for achieving the high frequency application.

Since the stray resistance of drain and source electrodes of the MOS device have been reduced by silicide process, the ESD current is easily guided to the LDD structure of the MOS device and causes the MOS device to be damaged. Even an output-stage MOS device with a larger size cannot enhance the ESD protection capability thereof.

A process of silicided diffusion blocking has been developed in the manufacturing process of the prior art for efficiently enhancing the ESD protection capability, in which a silicided layer is eliminated from the output-stage MOS device for raising resistance of the source and drain of MOS device therein.

FIG. 3A is the schematic diagram of a MOS device of the prior art, in which a plurality of source contacts 32*a* and 32*b* are included in an upper metal layer 31*a* and an under layer 31*b*, respectively, and further a plurality of drain contacts 33 is disposed in the midst of the MOS device. Moreover, a poly gate 34 is disposed therebetween for the purpose of current limitation.

FIG. 3B shows the drain with a silicide block of the MOS device. The space between drain contacts 33 and source contacts 32*a*, 32*b* should be of a suitable size for placement of the silicide block 35. The silicide block 35 is used to increase the resistance between the drain contacts 33 and the poly gate 34 to limit the current passed by, which enhancing the ESD protection capability of the MOS device meanwhile. Nevertheless, since the space between the drain contacts 33 and source contacts 32*a* and 32*b* becomes larger and the space occupied by MOS device increases in FIG. 3B, the number of the MOS devices that can be located is limited. In addition, the resistance increment of the device will increase the RC time constant delay of the input signal, which is not suitable to the input process of the high-frequency signal or the current signal.

Reference is made to FIG. 4, which shows an ESD protection circuit of an inner circuit disclosed in US Publication No. 2002/1030390. Both an ESD circuit 40 and an inner circuit 42 electrically connect with at least two wires 43, 44, which are a power supply cord and a zero potential cord, respectively.

The ESD circuit 40 includes an ESD protection circuit 410 between the wires 43, 44, and the ESD protection circuit 410 further includes an inverter 412 and a RC delay circuit 413. The ESD current produced from an ESD event can be discharged via an ESD path, which is formed by the forward-bias diode pair including diode D1, D2 or diode D3, D4, or by a substrate-triggered MOS 417 of the ESD protection circuit 410 operated in first breakdown zone A or the snap breakdown zone E. The CMOS inverter 412 is used to trigger the substrate-triggered MOS 417, and the gate thereon connects with the wire 44 via a resistor R2, which is to keep the substrate-triggered MOS 417 turned off when there is no ESD. The aforementioned ESD protection circuit 40 disposed between an input pad 45 and an inner circuit 42 provides the ESD path. The diode pairs including the diodes D1, D2, D3, and D4 are equivalent to the capacitors C1, C2, C3, and C4. The capacitor pair C1 and C2 is connected in parallel with the capacitor pair C3 and C4, and the equivalent capacitance decreases as the number of diodes increases.

Furthermore, even if the substrate-triggered MOS 417, the CMOS inverter 412 and the RC delay circuit 413 are included in the ESD protection circuit 40 shown in FIG. 4, the silicide block 35 shown in FIG. 3B is still needed.

When the silicide block is placed in the MOS device, it actually can enhance the ESD protection capability, but its equivalent resistance will also affect the performance in high frequency. Meanwhile, since space occupied by the silicide block becomes bigger, the number that can be set on a wafer is limited.

For improving the drawback due to the conventional ESD protection circuits, the present invention provides a device without the silicide block used in prior art, and still maintains the regular operating current in an inner circuit when electrostatic discharge (ESD) occurs.

SUMMARY OF THE INVENTION

Broadly speaking, the present invention provides an ESD protection device employing a MOS device and a latch-detected turned-on circuit, in which the MOS device includes a self-aligned silicidation (Salicide) to maintain a stable current through an inner circuit when ESD occurs, and more particularly, the embodiment of the present invention doesn't need a silicide block imposed therein.

More particularly, the ESD protection device comprises a latch-detected turned-on circuit, and further includes a capacitor and a second switch electrically connected with an inner circuit to be protected. A first switch is an NMOS made by a self-aligned silicidation process, in which a gate of the first switch connects with the latch-detected turned-on circuit. The ESD protection device operates in the turned-on condition of the first switch with stable current, not discharges in breakdown condition.

BRIEF DESCRIPTION OF THE DRAWINGS

The present invention will be readily understood by the following detailed description in conjunction accompanying drawings, in which.

DETAILED DESCRIPTION OF PREFERRED EMBODIMENTS

To allow those skilled in the art to understand the technology, means and functions adopted in the present invention further, reference is made to the following detailed description and attached drawings. Those skilled in the art shall readily understand the invention deeply and concretely from the purpose, characteristics and specification of the present invention. Nevertheless, the present invention is not limited to the attached drawings and embodiments in following description.

The aforementioned RC delay circuit of the prior art is used to latch the ESD voltage/current, which is discharged in certain time when it surpasses a determined voltage/current. In particular, the present invention provides a silicide block used to limit the ESD current because of the resistance increment between the drain and multiple silicon gate of the MOS device. The present invention provides an ESD protection device to control an ESD path switch in the turned-on condition by employing a MOS device and a latch-detected turned-on circuit, in which the MOS device includes self-aligned silicidation (Salicide) therein.

Figure 1:
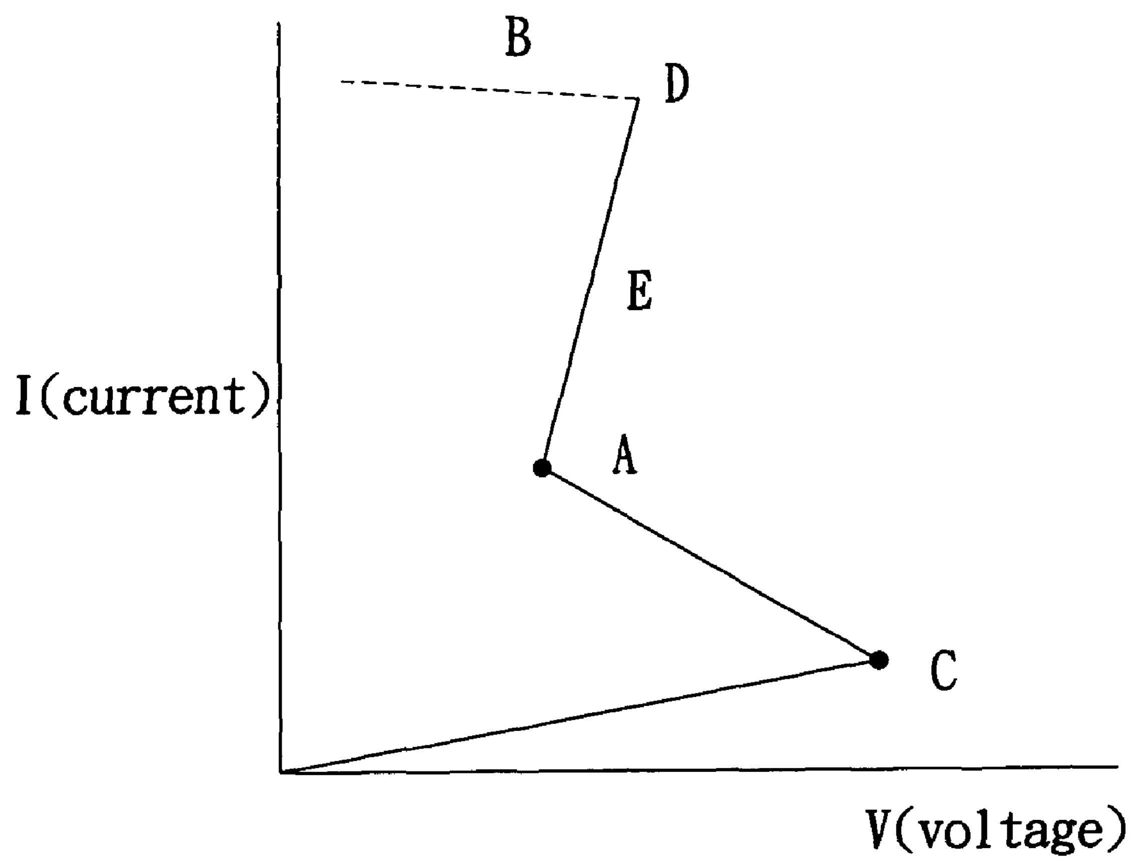
FIG. 1 is the UV characteristic curve of the ESD protection device of the prior art.
Figure 2:
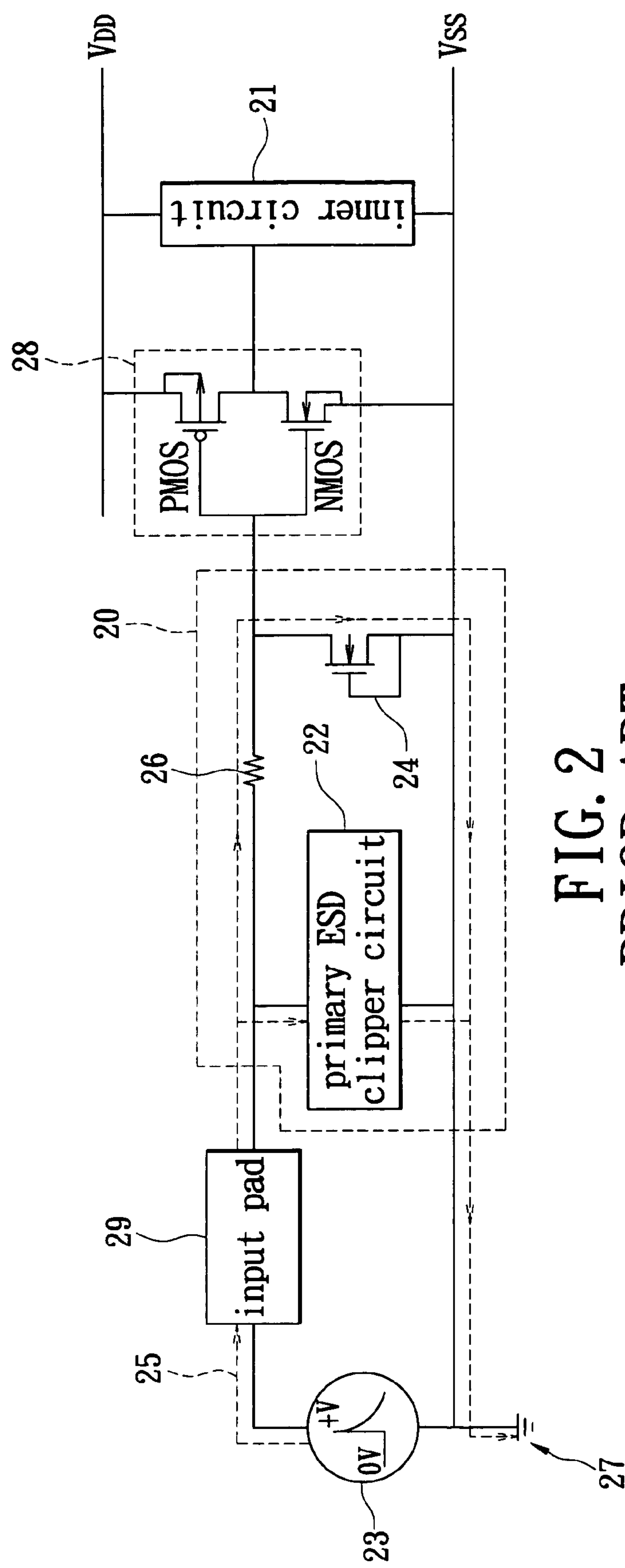
FIG. 2 is a schematic diagram of an ESD protection circuit of the prior art.
Figure 3A:
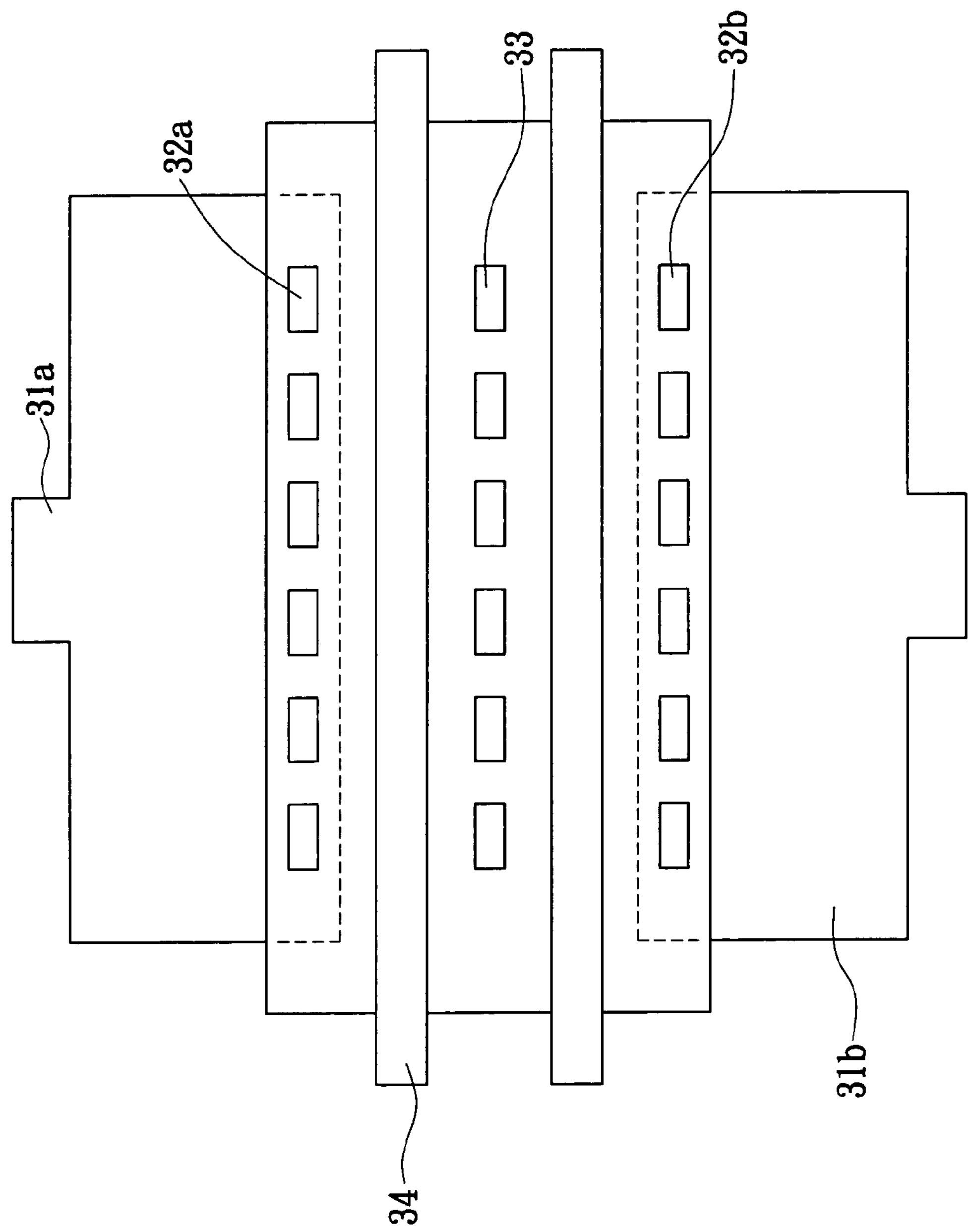
FIG. 3A is a schematic diagram of a MOS device of the prior art.
Figure 3B:
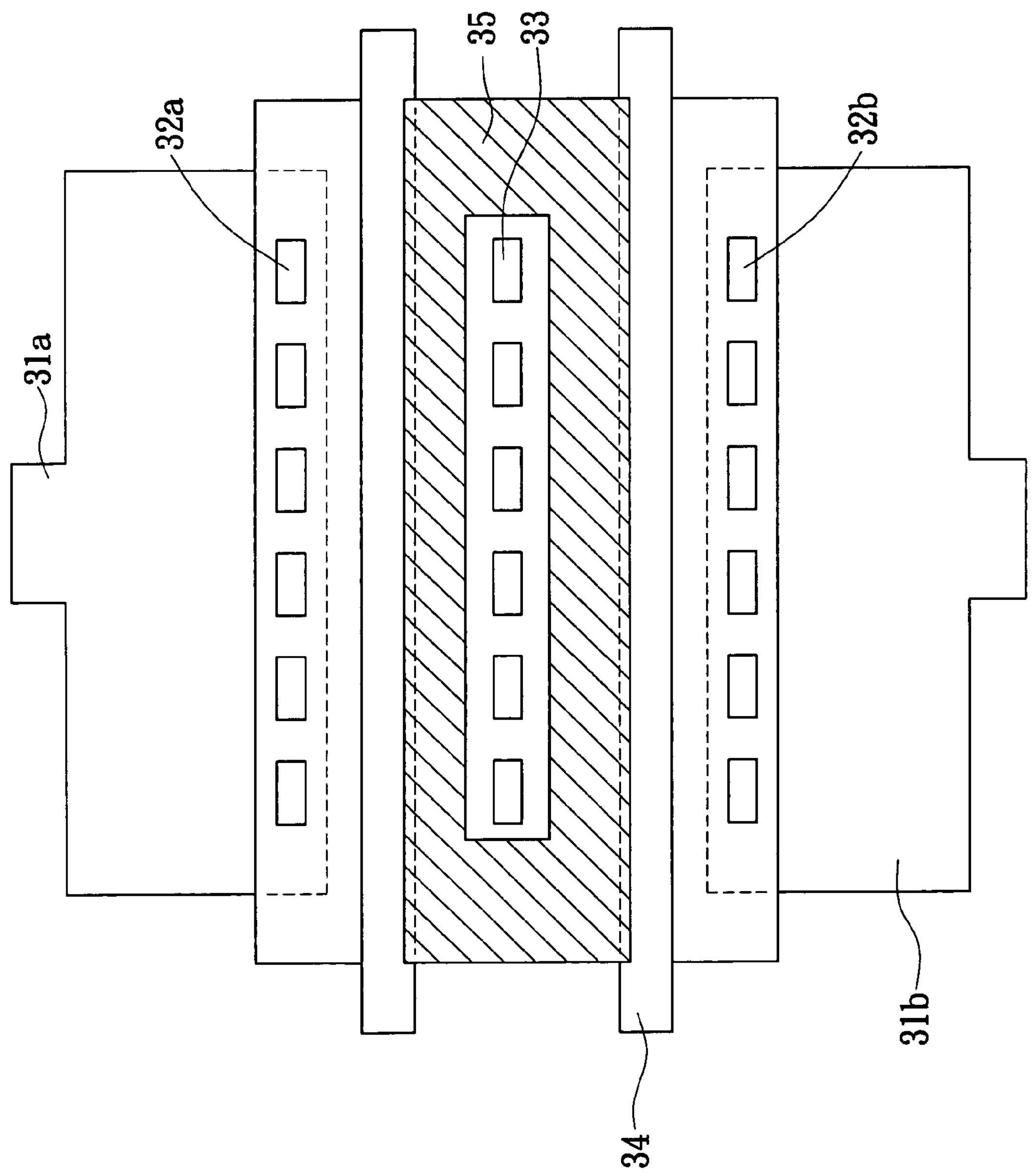
FIG. 3B is a schematic diagram of a silicide block disposed in the drain of a MOS device of the prior art.
Figure 4:
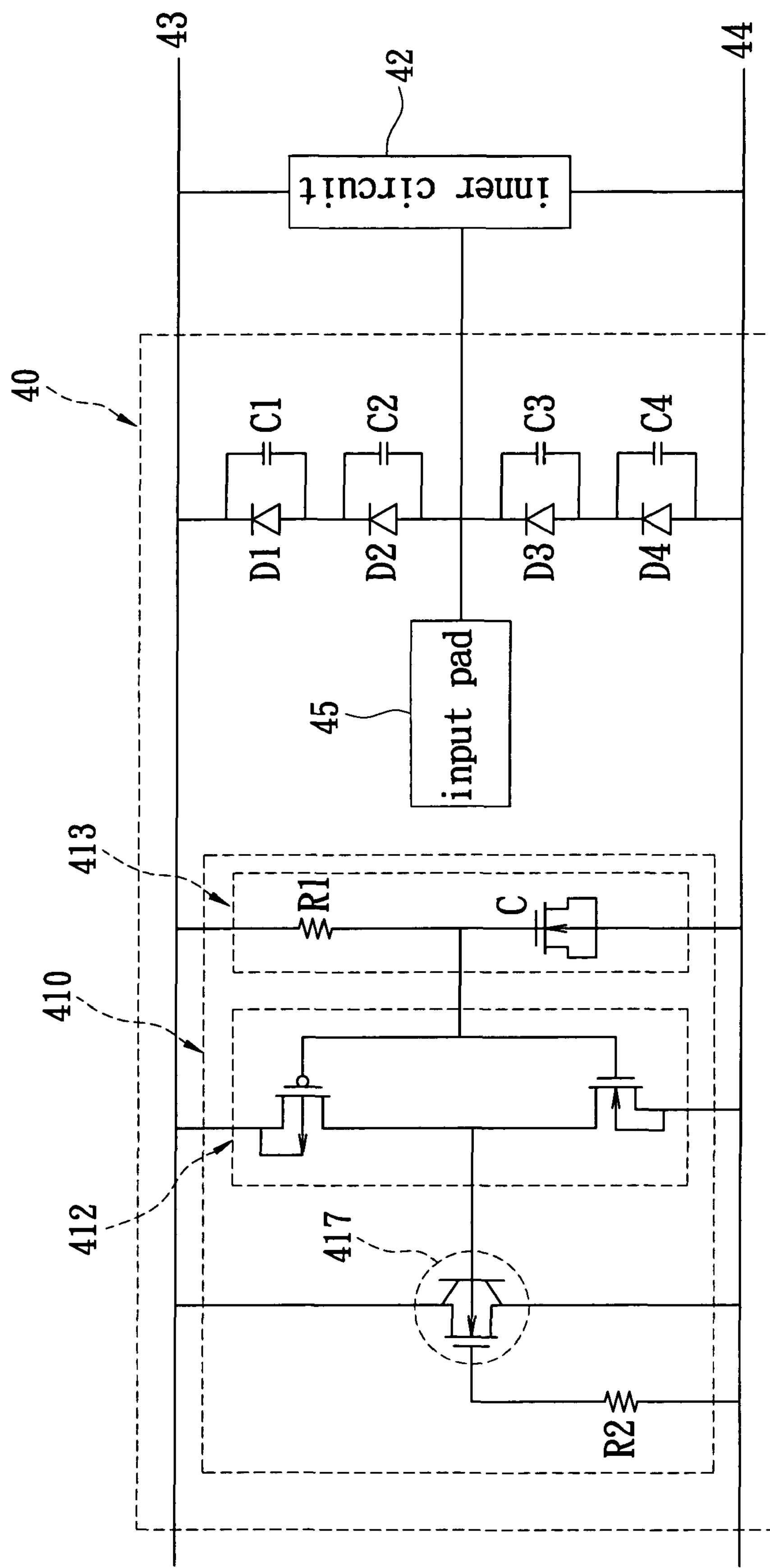
FIG. 4 is a schematic diagram of an inner circuit protected with an ESD protection circuit of the prior art.
Figure 5A:
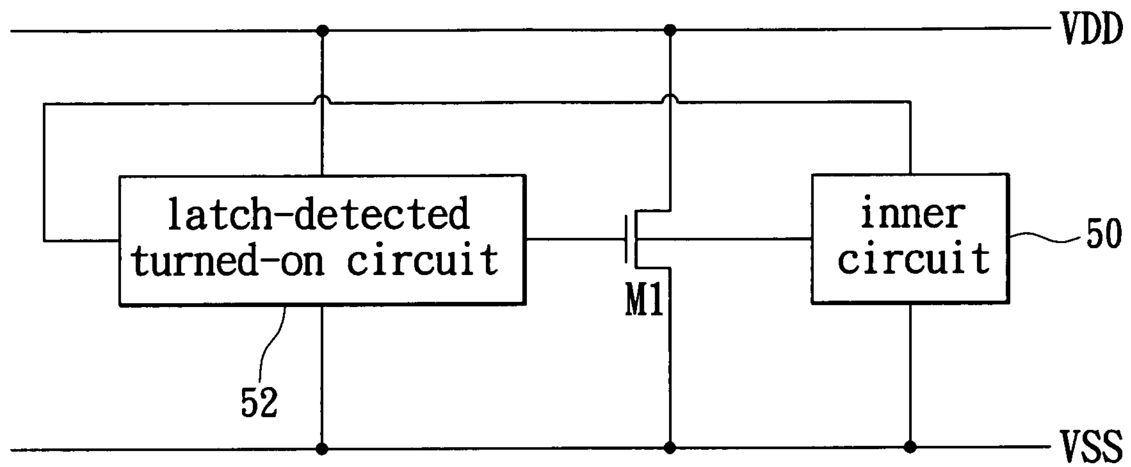
FIG. 5A is a schematic diagram of an ESD protection device of the present invention.

Reference is made to FIG. 5A showing an ESD protection device of the present invention, in which the ESD protection device bridges two voltage sources VDD, VSS, and the current flow is controlled by a switch implemented by NMOS or PMOS as the present embodiment. A first switch M1 disposed between the first voltage source VDD and the second voltage source VSS is the switch used for establishing the ESD path. The first switch employed in the present invention is implemented by NMOS, and manufactured with a self-aligned silicidation (Salicide) process. A detection circuit 52 implemented with a latch-detected turned-on circuit is electrically coupled with the gate of the first switch M1 to monitor the ESD status. Meanwhile, the gate of the first switch M1 electrically coupled with the inner circuit 50.

The first switch M1 is turned off when no ESD occurred during normal operations. Once ESD occurs, a high potential signal produced due to a capacitive coupling effect occurring in the detection circuit 52 is used to turn on the first ESD path switch M1. Then the ESD current produced by the first voltage source VDD is guided to the grounded second voltage source VSS.

The inner circuit 50 connects with the gate of the detection circuit 52, which is used to monitor the ESD event. The detection circuit 52 is used to control the electrical potential of the gate of the first switch M1, and the turn-on period of the first switch M1 as well. If the ESD current is higher than a determined threshold, the first switch M1 is turned on, and then waits for the discharging process. Therefore, the ESD protection device of the present invention does not process under the breakdown feature of some specific devices.

The aforementioned detection circuit 52 of the inner circuit 50 of the preferable embodiment is used to monitor the ESD event. More particularly, the silicide block is not employed to enhance the ESD protection capability in the present invention; only the transistor with self-aligned silicidation is adopted to reduce the parasitic effect and the area of the ESD protection device.

Figure 5B:
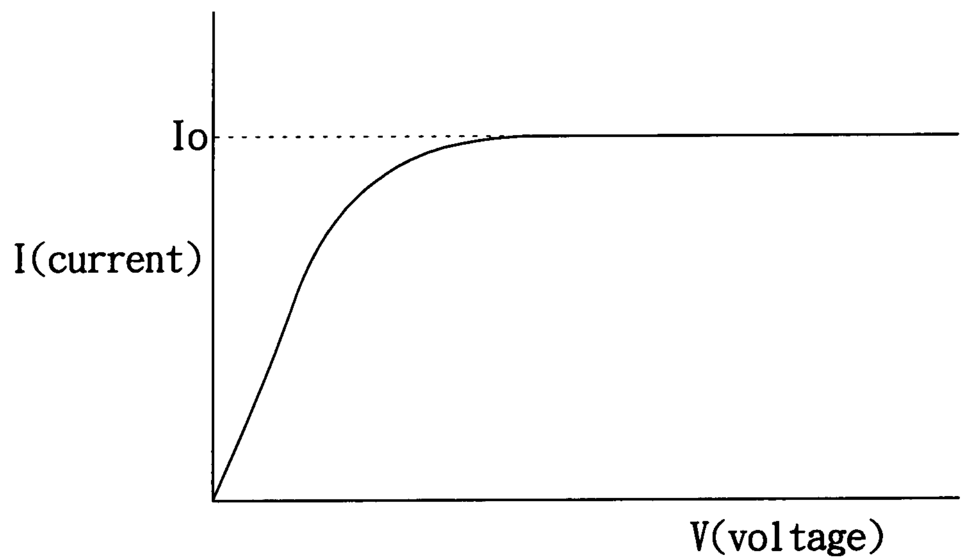
FIG. 5B is a characteristic diagram of the ESD protection device of the present invention.

The aforementioned detection circuit 52 is used to control the first switch M1 in accordance with occurrence of an ESD event. Even under an ESD event with high voltage, the inner circuit 50 operates with a stable ESD current $I_0$ as shown in the characteristic diagram of FIG. 5B. Broadly speaking, the ESD protection device of the present invention is used to discharge the ESD current based on the switching status of the first switch M1.

Figure 6:
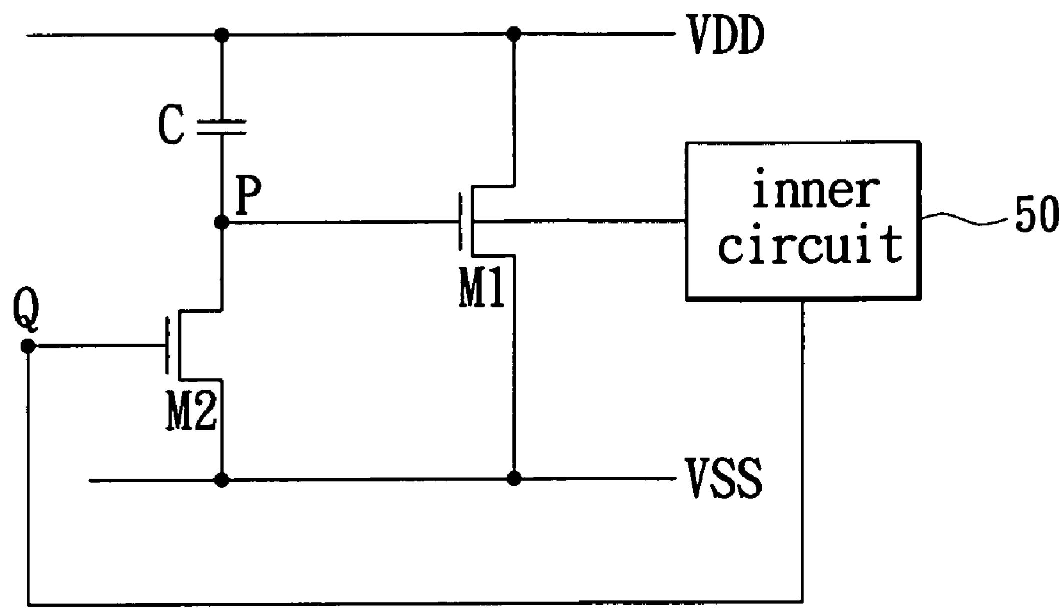
FIG. 6 is a schematic diagram of the first embodiment of the present invention.

FIG. 6 shows the first embodiment of the present invention, in which an ESD protection circuit bridges the first voltage source VDD and the second voltage source VSS. A first switch M1, a second switch M2, a capacitor C, and an inner circuit 50 electrically coupling the first voltage source VDD and the second voltage source VSS are included. During normal operation when ESD is not occurred, the potential of the gate (P) of the first switch M1 is low and the first switch M1 is turned off.

When the ESD protection mode is not turned on as mentioned above, the potential of the gate (Q) of the second switch M2 connected with the inner circuit 50 is high and the second switch M2 is turned on. When the second switch M2 is turned on, the ESD protection circuit can prevent the first switch M1 from being turned on by the noise produced from the first voltage source VDD.

In FIG. 6, when an ESD event occurs between the first voltage source VDD and the second voltage source VSS, the capacitor C starts charging, and the gate (P) of the first switch M1 will gradually be in high potential, which turns the first switch M1 on. Meanwhile, the drain (P) of the second switch M2 is also in high potential. Since the ESD event is monitored by the inner circuit 50, the potential of the gate (Q) of the second switch M2 becomes low when ESD event occurs, and turns the second switch M2 off. At this moment, the ESD protection device of the present invention provides an electrostatic discharge path from the first voltage source VDD to the second voltage source VSS.

Since the gate of the second switch M2 connects with the inner circuit 50, the second switch M2 can monitor the leakage status of ESD current, and further control the period that the first switch M1 is turned on by controlling the potential of gate (P) of the first switch M1 until the ESD current reaches a determined current value.

Figure 7:
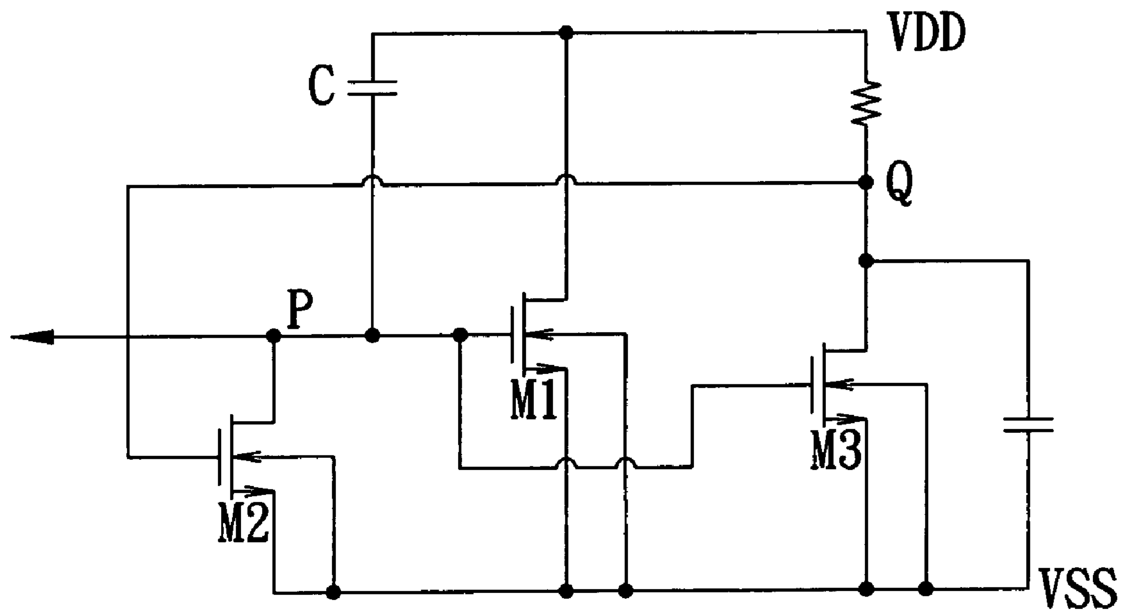
FIG. 7 is a schematic diagram of the second embodiment of the present invention.

FIG. 7 shows the second embodiment of the present invention. A first switch M1 is used as the ESD path switch of the embodiment, wherein the gate of the first switch M1 connects with the gate of the third switch M3 existing in an inner circuit. In normal operation without an ESD event, the gate (P) of the first switch M1 is in low potential, so the first switch M1 and the third switch M3 are turned off. Once ESD occurs, a capacitor C is coupled, and the gate (P) of the first switch M1 is in high potential to turn the first switch M1 on which formed an ESD path to guide the ESD current to the ground. Meanwhile, the gate (P) of the third switch M3 of the inner circuit is turned on as a result of the potential being high, and the second switch M2 is turned off since the potential of the gate (Q) of the second switch M2 is low. Since the ESD current is completely discharged, the potential of the drain (Q) of the third switch M3 and the gate (Q) of the second switch M2 is high, which turns the second switch M2 on, and the potential of the drain (P) of the second switch M2 and the gate (P) of the first switch M1 is low, which turns the first switch M1 off.

Figure 8:
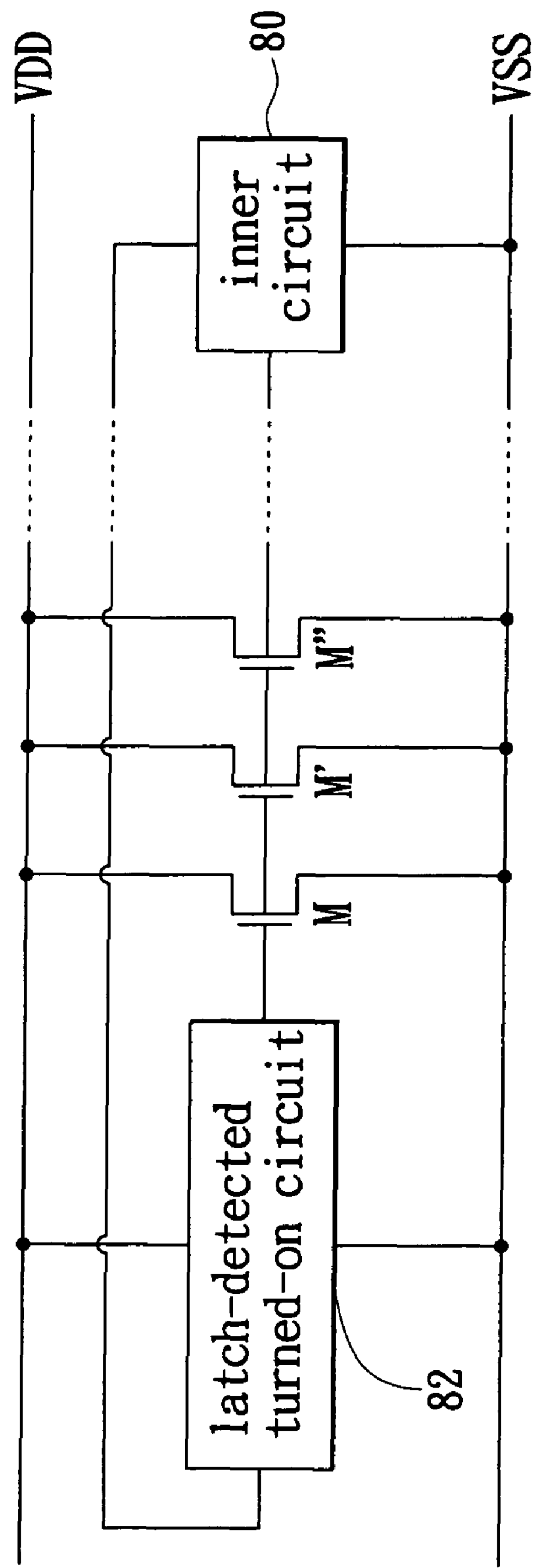
FIG. 8 is a schematic diagram of the third embodiment of the present invention.

A plurality of ESD protection circuits mentioned above can be connected in parallel between the two voltage sources (VDD, VSS) shown in FIG. 8, which is the third embodiment of the present invention. The switches formed by a plurality of transistors M, M', and M" are connected in parallel with each other. A detection circuit 82 and an inner circuit 80 are used to monitor the ESD condition between the voltage sources. For the purpose of enhancing the ESD protection capability of the present invention, an ESD protection device is used to turn each transistor (M, M', M") off or on, one by one, to establish one or a plurality of ESD paths accordingly. In this way, the turn-on timing of each transistor can be controlled to enhance the capability of ESD protection.

The ESD protection device can be efficiently implemented as a protection device of the power supply and further applied for protecting an I/O system in another embodiment.

The present invention relates to an ESD protection device employing a MOS and a latch-detected turned-on circuit with a Salicide process. The present invention is used to stabilize operation efficiency and reduce the area of an ESD protection device without a silicide block disposed for enhancing the ESD protection capability thereof.

The many features and advantages of the present invention are apparent from the written description above and it is intended that the appended claims to cover all. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

The invention claimed is:

1. An electrostatic discharge (ESD) protection device, operating under an ESD event, wherein the electrostatic discharge (ESD) protection device comprises:

a first transistor comprising a first source, a first gate and a first drain, wherein the first drain is coupled to a first voltage source and the first source is coupled to a second voltage source;

a capacitor comprising a first terminal coupled to the first voltage source and a second terminal coupled to the first gate;

a second transistor comprising a second source, a second gate and a second drain, wherein the second drain is coupled to the first gate and the second source is coupled to the second voltage source; and a third transistor comprising a third source, a third gate and a third drain, wherein the third source is coupled to the second voltage source, the third drain is coupled to the first voltage source, the third drain is coupled to the second gate, and the third gate is coupled to the first gate.

2. The ESD protection device as recited in claim 1, wherein the first transistor is made by a self-aligned silicidation process.

3. The ESD protection device as recited in claim 1, wherein the first transistor is a NMOS.

4. The ESD protection device as recited in claim 1, further comprising a plurality of MOS devices electrically coupled in parallel with the first transistor.

5. The ESD protection device as recited in claim 1, wherein the second switch is in a turned-off condition when ESD occurs.

6. The ESD protection device as recited in claim 1, wherein the second switch is in a turned-on condition when the ESD protection device is under a normal operation.

* * * * *